(12) United States Patent
Huotari et al.

(10) Patent No.: US 9,790,594 B2
(45) Date of Patent: Oct. 17, 2017

(54) COMBINATION CVD/ALD METHOD, SOURCE AND PULSE PROFILE MODIFICATION

(71) Applicant: ASM IP Holding B.V., Almere (NL)

(72) Inventors: Hannu Huotari, Espoo (FI); Tom E. Blomberg, Vantaa (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/568,145

(22) Filed: Dec. 12, 2014

(65) Prior Publication Data

US 2015/0099066 A1    Apr. 9, 2015

Related U.S. Application Data

(63) Continuation-in-part of application No. 14/014,435, filed on Aug. 30, 2013, now abandoned, which is a continuation of application No. 12/979,449, filed on Dec. 28, 2010, now Pat. No. 8,524,322.

(51) Int. Cl.
| | |
|---|---|
| *C23C 16/00* | (2006.01) |
| *C23C 16/44* | (2006.01) |
| *C23C 16/455* | (2006.01) |
| *C23C 16/52* | (2006.01) |

(52) U.S. Cl.
CPC ........ *C23C 16/44* (2013.01); *C23C 16/45525* (2013.01); *C23C 16/45544* (2013.01); *C23C 16/45561* (2013.01); *C23C 16/52* (2013.01)

(58) Field of Classification Search
CPC .............. C23C 16/44; C23C 16/45544; C23C 16/45525
USPC ............... 427/255.39, 255.28, 255.23, 248.1
See application file for complete search history.

(56) References Cited

U.S. PATENT DOCUMENTS

| | | |
|---|---|---|
| 4,917,136 A | 4/1990 | Ohmi et al. |
| 6,539,891 B1 | 4/2003 | Lee et al. |
| 6,562,140 B1 | 5/2003 | Bondestam et al. |
| 6,592,942 B1 | 7/2003 | Van Wijck |
| 6,645,302 B2 | 11/2003 | Udagawa |
| 6,699,524 B2 | 3/2004 | Kesala |
| 6,981,517 B2 | 1/2006 | Snijders |
| 7,020,981 B2 | 4/2006 | Shero et al. |
| 7,732,350 B2 | 6/2010 | Hasper et al. |

(Continued)

*Primary Examiner* — Kelly M Gambetta
(74) *Attorney, Agent, or Firm* — Seppo Laine Oy (57) ABSTRACT

The present invention relates generally to methods and apparatus for the controlled growing of material on substrates. According to embodiments of the present invention, a precursor feed is controlled in order to provide an optimal pulse profile. This may be accomplished by splitting the feed into two paths. One of the paths is restricted in a continuous manner. The other path is restricted in a periodic manner. The output of the two paths converges at a point prior to entry of the reactor. Therefore, a single precursor source is able to fed precursor in to a reactor under two different conditions, one which can be seen as mimicking ALD conditions and one which can be seen as mimicking CVD conditions. This allows for an otherwise single mode reactor to be operated in a plurality of modes including one or more ALD/CVD combination modes. Additionally, the pulse profile of each pulse can be modified. The pulse profile can be modified to create a low or very low partial pressure pulse profile at the beginning of a pulse.

11 Claims, 7 Drawing Sheets

(56) References Cited

U.S. PATENT DOCUMENTS

| | | |
|---|---|---|
| 8,211,230 B2 | 7/2012 | Verghese et al. |
| 8,524,322 B2 | 9/2013 | Blomberg |
| 2005/0000428 A1 | 1/2005 | Shero et al. |
| 2008/0003838 A1 | 1/2008 | Haukka et al. |
| 2008/0085226 A1* | 4/2008 | Fondurulia ......... C23C 16/4481 422/198 |
| 2008/0317955 A1 | 12/2008 | Li |
| 2008/0317972 A1 | 12/2008 | Hendriks et al. |
| 2009/0214786 A1 | 8/2009 | Chang et al. |
| 2010/0154479 A1* | 6/2010 | Milicevic .......... C03B 37/01807 65/391 |
| 2010/0266765 A1 | 10/2010 | White et al. |

* cited by examiner

COMBINATION CVD/ALD METHOD, SOURCE AND PULSE PROFILE MODIFICATION

FIELD OF INVENTION

The present invention relates generally to methods and apparatus for the controlled growing of material on substrates. Two common technologies in the present field are ALD and CVD, each having a plurality of drawbacks. The present invention offers a method and apparatus for combining at least some of the positive aspects of both ALD and CVD processes. Additionally, the pulse profile of each pulse can be modified. The pulse profile can be modified to create a low or very low partial pressure pulse profile at the beginning of a pulse.

BACKGROUND OF INVENTION

Thin film deposition is used to build materials by in essence growing material on a surface, commonly a substrate. These materials have many uses in microelectronics as well as in other fields. Two well known thin film deposition techniques are Atomic layer deposition (ALD) and Chemical Vapor Deposition (CVD). In each technique, reactants, i.e. precursors often in the form of gasses, are fed into a reactor which over a period of time forms a desired material.

During normal operation of Atomic Layer Deposition (ALD) reactors, two or more reactants are alternatingly introduced to the reactor. For ideal operation, the switching of gases in the reactor should be as fast and thorough as possible. This makes ALD inherently slow as purging gas volumes is slow and difficult.

Chemical Vapor deposition (CVD) is based on the continuous flow of a precursor/precursors to the reactor. Thus, the growth per minute of CVD is generally higher than that in ALD. Due to different requirements for the ALD and CVD reactors, a CVD reactor historically cannot typically be easily used for ALD growth of films successfully.

For example, in typical ALD reactors the gas volume in the reactor should be as small as possible. In CVD reactors, the accurate and uniform concentration distribution over the substrate is a typical design criterion. For CVD reactors, said accurate and uniform concentration distribution is more important than the low volume required by ALD designed reactors.

Source delivery principles are also very different when comparing typical ALD and CVD reactors. In ALD reactors, it is desirable for the injection of a concentrated precursor pulse to occur quickly along with the subsequent fast and thorough purging of the flow channel. To the contrary, in CVD, the steady and controllable partial pressure flux from the source is the most important design factor.

Because CVD is older than ALD, CVD reactor geometry has been optimized for the past several decades and is a considerably mature technology. Therefore, it would be very desirable if current CVD reactors could be modified to function more, or entirely in an ALD mode.

SUMMARY OF THE INVENTION

The object of the present invention is to provide a method of operating a system having a reactor configured to deposit thin films.

Furthermore, it is an aspect of certain embodiments of the present invention to provide a method of selectively operating a system having a reactor configured to deposit thin films in at least one of the following modes: ALD mode, CVD mode and ALD/CVD combination mode.

Some precursor chemistries which are used in ALD methods can also work successfully in CVD methods, though the partial pressures of the precursors in the reactor should be accurately controlled. At least in these cases it is possible to grow films in a combination mode where the ALD/CVD film growth mechanisms take place simultaneously.

Accurately controlling the precursor fed into the reactor, especially during an ALD/CVD combination mode enables certain benefits. One result is that a relatively higher proportion of the ALD mode leads to better step coverage of the film. However, a relatively higher proportion of the CVD mode leads generally to higher throughput. As good uniformity and low impurity levels in the films can be achieved with both growth mechanisms, accurately controlling the feed of the precursor allows a user to be able to better control the desired output of the thin film deposition process.

In order to effectively and efficiently control the precursor fed into a reactor, it is beneficial to have a single reactor inlet for each precursor. Additionally, it is most efficient to have a single precursor source for each precursor. However, when operating in an ALD/CVD combination mode, at least one precursor will need to be fed in to the reactor under different conditions. Therefore, there exists a need for a way to effectively and efficiently control a precursor from the time that it leaves its source until it enters a reactor under at least two different sets of conditions.

According to embodiments of the present invention, a precursor fed is split in to two paths from the precursor source. One of the paths is restricted in a continuous manner. The other path is restricted in a periodic manner. The output of the two paths converges at a point prior to entry of the reactor.

Therefore, according to embodiments of the present invention, a single precursor source is able to fed precursor in to the reactor under two different conditions, one mimicking ALD conditions and one mimicking CVD conditions. This allows for an otherwise single mode reactor to be operated in a plurality of modes including an ALD/CVD combination mode.

Additionally, the pulse profile of each pulse can be modified. The pulse profile can be modified to create a low or very low concentration pulse profile at the beginning of a pulse. The pulse profile can be controlled to provide a more uniform reaction which can prevent the creation of particles and non-uniform parasitic CVD growth, for example.

DETAILED DESCRIPTION OF EXEMPLARY EMBODIMENTS

Different applications of thin film technology have different quality and output requirements for their associated materials. A system which is capable of growing thin films according to specific needs of a certain application is desirable. It is also desirable to create such a system which involves the least amount of modification from current systems as possible to be able to already refined components.

Figure 1:
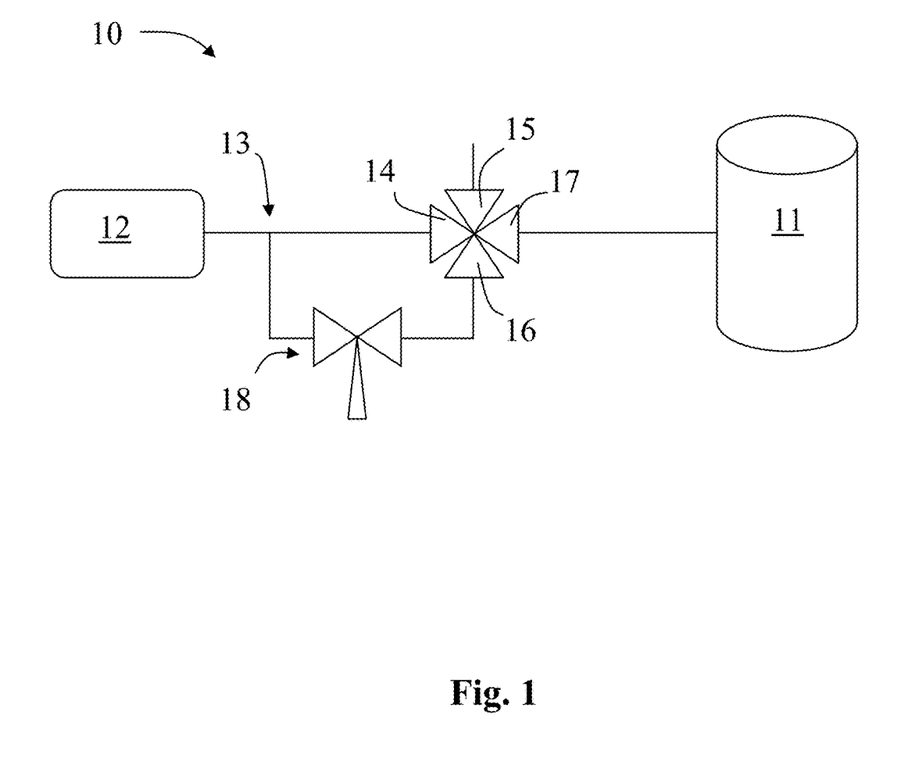
FIG. 1 shows a general embodiment according to the present invention showing a portion of a system 10 having a reactant source vessel 12 feeding a reactor 11, wherein the flow of the reactant is controlled collectively via a 4-way valve and a needle valve.

FIG. 1 shows a portion of a precursor fed arrangement to a reactor 11 of a system 10 according to an embodiment of the present invention. In order to modify an existing system in the least invasive way, it is preferable to have a single outlet from a precursor source 12 and a single inlet to a reactor 11 for each precursor. The present embodiment can be realized as its own system or as a modification of an existing system.

As CVD is an older technique compared to ALD, CVD reactor geometries has been optimized over a greater period of time and can be considered more refined. It is therefore desirable if current CVD reactors can be modified to function at least partially in the ALD mode. To at least that extent, a system including a reactor optimized for CVD operation can be modified in accordance with the present disclosure. Additionally, the reactor of the present system can be that of an ordinary reactor optimized for CVD operation.

Examples of suitable reactors can be found at least in U.S. Pat. No. 6,562,140, U.S. Pat. No. 6,592,942, U.S. Pat. No. 6,539,891, U.S. Pat. No. 7,020,981 and US Publication 2006/0266289, all of which are herein incorporated by reference. Furthermore, examples of precursor source configurations can be found at least in U.S. Pat. No. 6,699,524, U.S. Pat. No. 6,981,517, US Publication 2010/0266765, US Publication 2008/0085226 and US Publication 2005/0000428 which are herein incorporated by reference. For example, the reactor can be for depositing thin-films on silicon wafers as described in the incorporated references U.S. Pat. No. 6,562,140 and U.S. Pat. No. 7,020,981.

Although, for at least the reasons stated above, it is desirable for the reactor described herein to be one optimized or designed for CVD operation, the present embodiments can also utilize a reactor optimized or designed for ALD or other compatible operation. During deposition, the reactor should have one or more substrates positioned inside the reaction chamber. Similarly, the present embodiments can be realized as modifications to systems including at least one precursor and a reactor which is not optimized for CVD, such as ALD or other compatible operation.

Retuning to FIG. 1, a precursor or reactant can flow from a precursor source 12 to a reactor 11 via two paths. The two paths split at point 13, a first which can be continuously restricted via a valve 18 and a second which is controlled by valve 14. In FIG. 1, both paths converge at a four-way valve 14, 15, 16, 17 and continue from 17 in a single path to the reactor 11.

During operation of a system 10 in a CVD mode, valves 14 and 15 are closed, valves 16 and 17 are open and valve 18 restricts the flow of the precursor from the precursor source 12 to the reactor 11 in a continuous manner according to CVD conditions. In particular, valve 18 regulates the partial pressure of the precursor entering the reactor 11. Valve 18 can be a needle valve, a mass flow controller or any other suitable regulator.

The placement of valve 18 can be anywhere along the first path. The first path can start at the point 13 where the first and second paths diverge. Alternatively, there can be two outlets from the precursor source, one for each of the first and second paths. Similarly, it is preferable that the first path ends at the point where the first and second paths rejoin prior to entry of the reactor space, e.g. the four way valve of FIG. 1.

During operation of a system 10 in an ALD mode, at least one of valves 16 and 18 are closed for the duration of operation. In order to avoid any undesirable back flow, it is preferable that at least valve 16 remains closed for the duration of operation in the ALD mode. At least one valve 14 is located along a second path which is capable of substantially and/or completely restricting the flow of the precursor to the reactor 11. In the present embodiment, said valve 14 is a portion of a four-way valve which further includes valve 15 which controls the flow a purge gas.

With valve 16 closed the remaining active portion of the system functions according to normal ALD operation. Precursor is admitted past valve 14 and 17 in to the reactor 11 for a predetermined amount of time until the flow is ceased, or substantially ceased, via valve 14 so that the purge gas from valve 15 can flow through 17 and in to the reactor 11 for a second predetermined amount of time.

Therefore, at least through the control of the four way valve, a portion of a system in accordance with FIG. 1 having a precursor source with a single outlet and a reactor with a single inlet, can selectively be operated in an ALD or a CVD mode. Additionally, the present system can selectively operate in a combination ALD/CVD mode.

During operation of a system in a combination ALD/CVD mode, precursor from both the first and second paths enters the reaction space. In an embodiment according to the present invention, during operation in a combination ALD/CVD mode, valve 16, or the combination of valves 16 and 17, allows a continuous amount of precursor from the first path to enter the reactor 11. The continuous amount of precursor from the first path is determined and controlled by valve 18.

Simultaneously, valves 14 and 15 operate similar to a standard ALD process. An amount of precursor is allowed through valve 14 for a first predetermined amount of time before the valve is close. Then an amount of purge gas flows through valve 15 for a second predetermined amount of time. In some instances, a small amount of precursor can be allowed to "bleed" through valve 14 while the valve is substantially closed, for example to avoid high pressure buildup behind valve 14.

Therefore, there is always at least the amount of precursor from the first path which is able to enter the reactor 11 from the precursor source 12. The remainder of the material entering the reactor from the inlet is alternatingly made up of the additional precursor from the second path and the purge gas. The control of the portion of the system, e.g. the control of the valves, the timing of the valves, the amount of precursor that enters the reactor at any given time, can all be chosen or controlled to achieve the desired characteristics of the desired material and growth process.

In another method of operation, valve 16 is only opened when valve 14 is closed. Therefore, there is only precursor from one path entering the reactor at any given time, though there is always some of the precursor entering the reactor.

An important characteristic to control during operation of a system in CVD or ALD/CVD combination mode is the partial pressures of precursors in the reactor. While several portions of the system can be used to monitor or regulate the total partial pressure of a precursor in a reactor either separately or in combination, e.g. 14, 15, 16, 17, an advantage of the present system and method of operation is that valve 18 can regulate the partial pressure of the precursor from precursor source 12 during the entire operation in CVD or ALD/CVD combination mode.

During actual operation, control of valve 18 can properly maintain the desired partial pressure of precursor in the reactor. However, preferably before operation, a user can select the proportion of ALD and CVD mode which is to be used during operation. For example, if good step coverage of the film is desired then more ALD mode can be chosen. In such an example, the average amount of precursor from the first path is limited so that more growth in the reactor is caused by the pulsed precursor from the second path then from the continual precursor from the first path.

Figure 2:
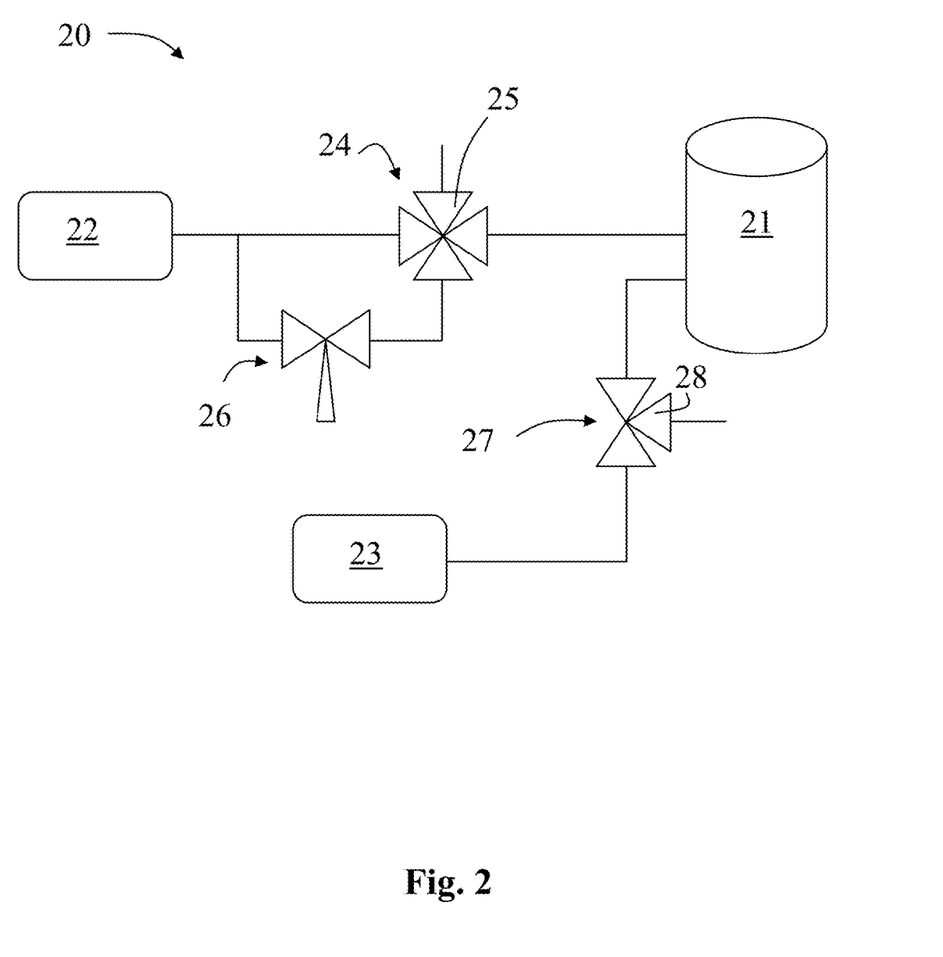
FIG. 2 shows an embodiment according to the present invention showing a portion of a system 20 similar to FIG. 1, but further showing a second reactant source vessel 23, wherein the flow of the first reactant is controlled collectively via a 4-way valve and a needle valve and wherein the flow of the second reactant is controlled via a single valve.

If quick production is desired, then more CVD mode can be chosen. In such an example, the average amount of precursor from the first path can be larger so that there is more growth in the reactor from the continual precursor from the first path. One of ordinary skill in the art will recognize a plurality of ways in which the present system can be controlled to provide desired growth characteristics within a reactor of the system operating in a combination ALD/CVD mode having two precursor paths for a precursor. In many applications of thin film deposition multiple precursors are required. FIG. 2 shows an embodiment of the present invention with a system 20 having two precursor sources 22 and 23 feeding to a single reactor 21. In certain applications, one of two or more precursors is required in greater amounts than the other(s). In these applications, one precursor source can operate in an ALD/CVD combination mode while the other operates in only an ALD mode. In FIG. 2, the precursor source 22 is part of a similar arrangement as described with regards to FIG. 1. Precursor source 23 is part of a standard ALD arrangement having a control valve 27 having a valve 28 for controlling a purge gas.

The operation of the arrangement of valves 24, having a valve 25 for controlling a purge gas, and 26 is similar to that described above with regards to valves 14-18. In the arrangement of system 20, precursor source 22 will be the precursor source for the precursor which is needed in greatest quantity for the deposition process. Examples of some processes which can utilize or be enhanced by the present invention can be found at least in U.S. Pat. No. 7,732,350, U.S. Publication 2008/0317972 and U.S. Publication 2008/0003838 which are herein incorporated by reference.

An example of a use for system 20 is for the formation of Titanium nitride (TiN) films in a reactor. Two precursors which can be used to form TiN films are ammonia ($NH_3$) and titanium chloride ($TiCl_4$). In order to increase output, the precursor of precursor source 22 is ammonia and the precursor of precursor source 23 is titanium chloride. In a normal ALD operation mode, ammonia from 22 and titanium chloride from 23 is alternatingly pulsed in to the reactor 21. In between each pulse the last precursor is purged via its respective purge gas from either 25 or 28 prior to the next precursor pulse.

During operation of system 20 in an ALD/CVD combination mode, ammonia from 23 can flow in to the reactor 21 during the ammonia purge step through the first path which is controlled by valve 26. In this manner, the amount of ammonia which enters the reactor can increase in the same time interval which is required during ALD operation. This allows either more TiN to form in the same given time, or it allows for the pulse time for ammonia to decrease allowing for shorter overall process time.

The present arrangement of system 20 allows for numerous precursor control scenarios. For instance, ammonia can be allowed to flow from the first path in to the reactor through valve 26 and/or 24 during one or more of: the ammonia purge step, the entire ammonia pulse step, some or all of the titanium chloride pulse step and in between some or all of the pulse steps. Valve 26, 24 or the combination of valves 26 and 24 can regulate the amount and pressure of ammonia entering the reactor in a continuous, or discontinuous manner as appropriate based on when in the process ammonia from the first path is desired to be entered into the reactor.

Figure 3:
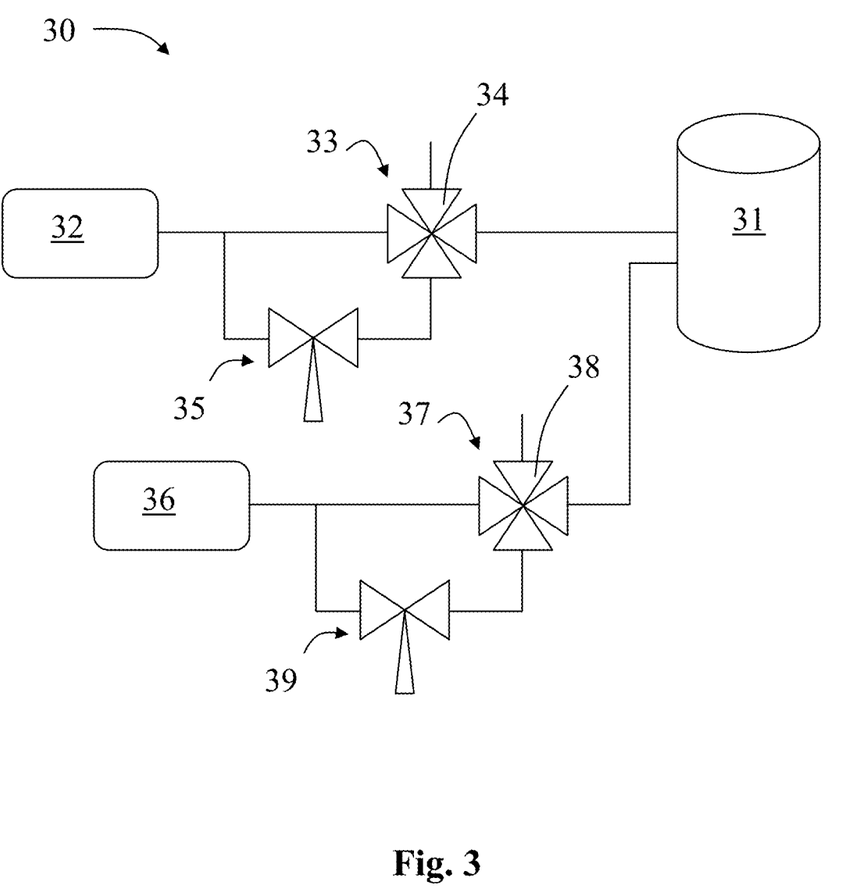
FIG. 3 shows an embodiment according to the present invention having a reactor 31 fed by two reactant source vessels 32 and 36, wherein the flow of each reactant source vessel is controlled collectively via a 4-way valve and a needle valve.

Although the present example is directed to the formation of titanium nitride from two precursors, ammonia and titanium chloride, the system and method of operation can be used for various other chemical depositions. FIG. 3 shows a system 30 which has a reactor 31, two precursor sources 32 and 36, each precursor source having an arrangement of paths and valves 33-35 and 37-39 respectively which can be arranged and operate as discussed above. System 30 can be operated as was described in the titanium nitride example above with ammonia in either 32 or 36 and with titanium chloride in the other source. The valve arrangements connected to the titanium chloride precursor source would then operate only in an ALD mode while the valve arrangements connected to the ammonia source would operate in an ALD/CVD combination mode as described.

Therefore, in a system having multiple precursor sources connected to a reactor in an arrangement as described for instance in FIG. 1, each precursor source arrangement can be independently selectively operated in an ALD mode, CVD mode, ALD/CVD combination mode or an off mode if it is not required in a particular deposition. Generally, one or more of the precursors in a system as described herein can comprise a transition metal. Some examples of transition metals, specifically transition metal halides, which can be used in the present systems are $TiCl_4$, $WF_6$, $TaCl_5$, $TaF_5$, $MoF_x$, $ZrCl_4$ or $HfCl_4$. In some cases, one or more of the precursors in a system as described herein can comprises silicon, which may be preferably silicon halide, for example $SiCl_4$, or a silicon compound with organic ligands, which may be preferably aminoligands, for example bis(dimethylamino)silane, bis(diethylamino)silane, bis(ethylmethylamino)silane, di-isopropylaminosilane and/or hexakis(ethylamino)disilane. Additionally, examples of other reactants which can be used with the aforementioned transition metals, alone or with other reactants are $NH_3$, $H_2O$, $O_2$ and $O_3$. Plasmas and radicals containing nitrogen, oxygen or hydrogen species can also be used as other reactants.

Figure 4:
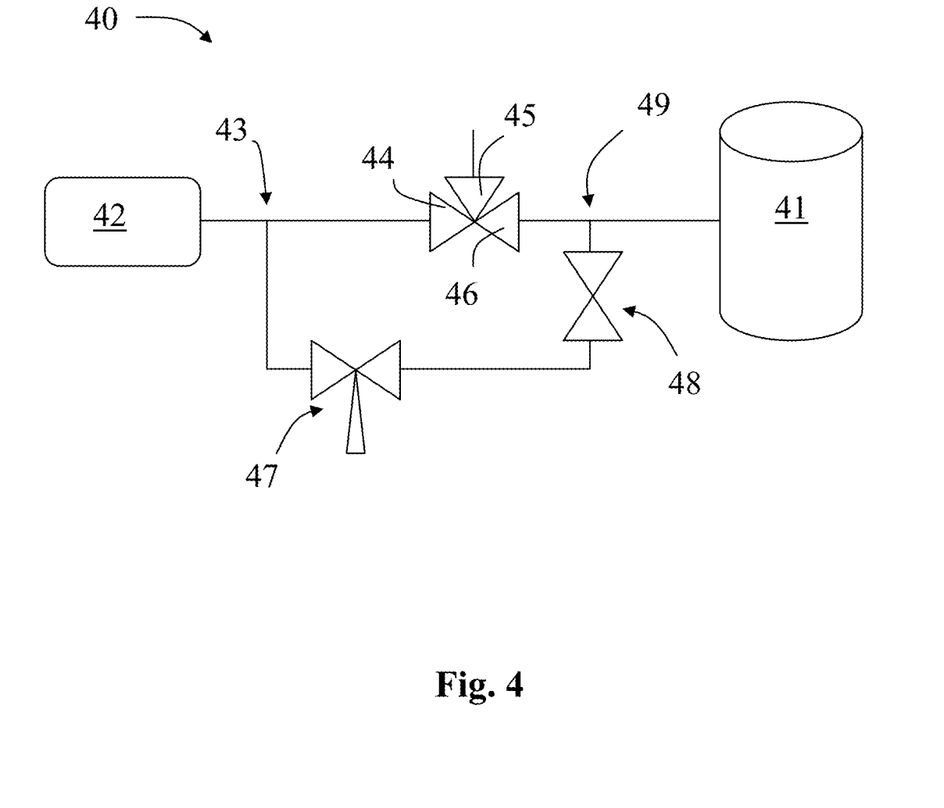
FIG. 4 shows an alternative general embodiment according to the present invention showing a portion of a system 40 having a reactant source vessel 42 feeding a reactor 41, wherein the flow of the reactant is controlled collectively via a plurality of valves.

FIG. 4 shows an alternative arrangement of valves in a portion of a system 40, similar to that of FIG. 1, but without a four way valve. In FIG. 4, precursor from the precursor source 42 can flow to the reactor 41 via a first and second path. The two paths diverge at point 43 and rejoin at point 49 prior to entry to the reactor 41. Prior to the point of rejoinder 49, each path has its own valve which controls the output of the path, 48 for the first path and 44/46 for the second path. The first path includes a valve 47 and the second path includes a valve 45 for controlling a purge gas, both as previously described. Locations 43 and 49 can be virtually anywhere along the overall path between the precursor source 42 and reactor 41. As discussed above, it is preferable that there is only one outlet from the precursor source and one inlet to the reactor for each precursor. However, it is conceivable that there are two outlets from the precursor source (not shown), one dedicated to each path. Additionally, in order to avoid unnecessary dead space in the system, it is desirable to locate point 49 as close to valves 44-46, an optimal location being at a four way valve.

Figure 5:
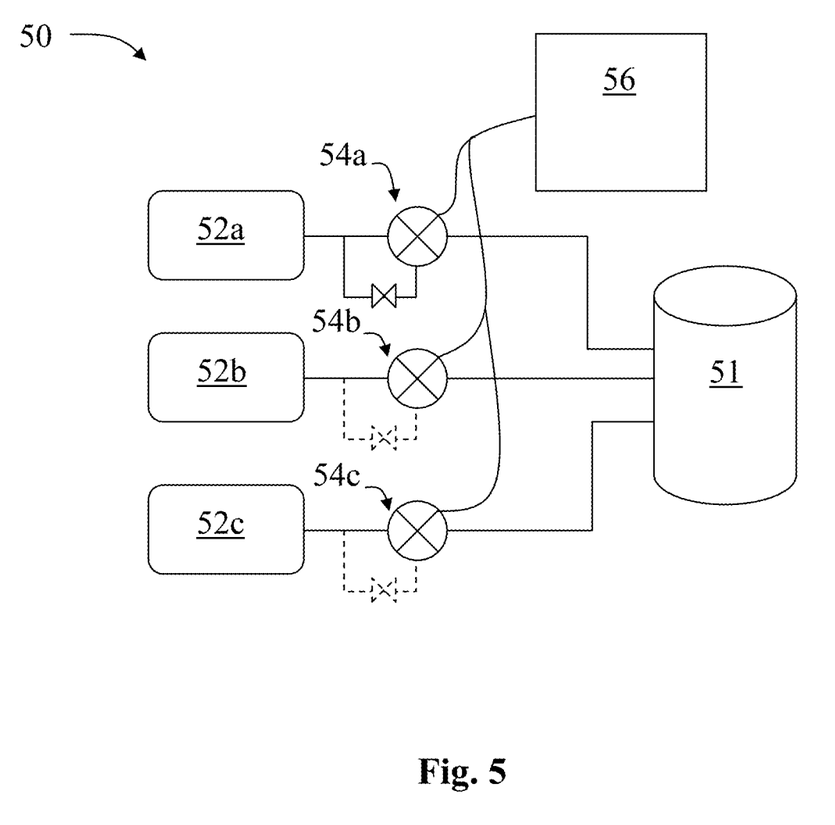
FIG. 5 shows a schematic of a system 50 according to an embodiment of the present invention which is capable of operating a reactor 51 in an ALD-CVD combination mode for depositing thin films on a substrate, said system having a plurality of reactant source vessels 52a-c, wherein the flow from each reactant source vessel to the reactor is controlled via a set of corresponding valves 54a-c, said sets of valves being controlled by a system controller 56.

FIG. 5 shows an example of a system 50 having a plurality of precursor sources 52a-c, each precursor source having an arrangement of valves 54a-c. Each of the arrangement of valves can include multiple paths as shown in solid lines for 54a allowing for the precursor source arrangement to operate in an ALD/CVD combination mode. In an embodiment, all of the arrangements 54a-c are similar or identical and are in accordance with the arrangements discussed with regards to FIGS. 1 and 4. In said embodiment, all of the arrangements 54a-c can be operated selectively in either an ALD mode, CVD mode, ALD/CVD combination mode or an off mode if not all of the arrangements are necessary.

In another embodiment, only some of the arrangements are in accordance with the arrangements for ALD/CVD combination mode, 54a. The other arrangements 54b and 54c can be fixed ALD, CVD or other arrangements. In such an embodiment, any or all of the arrangements 54a-c can be operated in a fixed mode, i.e. where the operation mode is not selectable.

The system 50 is controlled by at least one controller 56. Controller 56 can be a processor, CPU, server, mainframe or other suitable controller or device which is capable of controlling the flow of precursors from their respective precursor sources 52a-c to the reactor 51 via their respective valve arrangements 54a-c.

Figure 6:
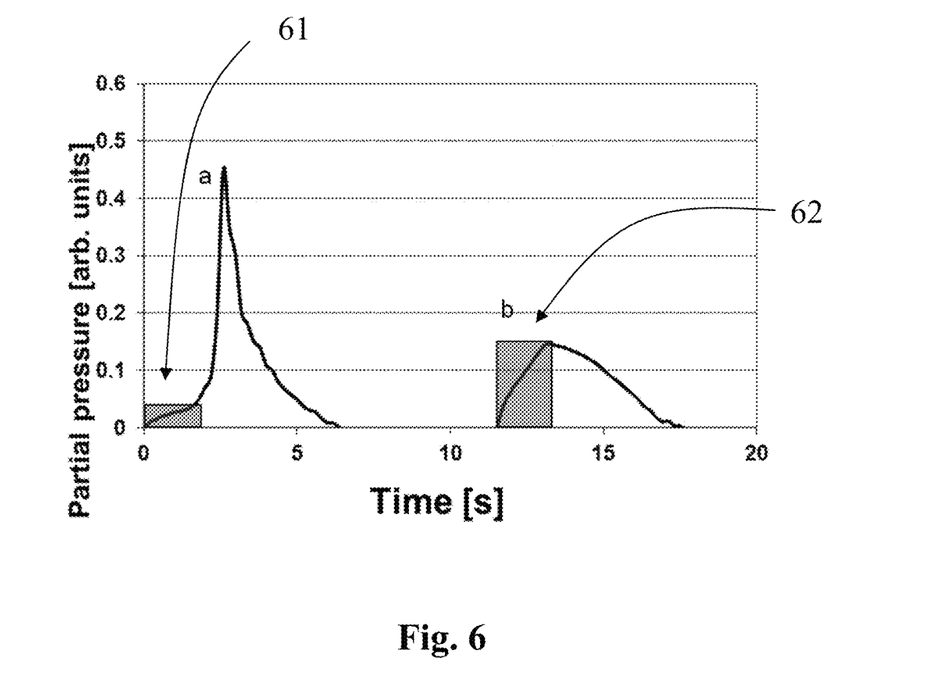
FIG. 6 shows pulse profiles created by certain embodiments. The concentration of the precursor is controlled such that initially a low concentration of precursor is present in the reactor.

FIG. 6 shows pulse profiles created by certain embodiments. The partial pressure or partial pressure profile of the precursor is controlled such that initially a low partial pressure of precursor is present in the reactor. Partial pressure in this context can also be understood to comprise concentration.

Figure 7:
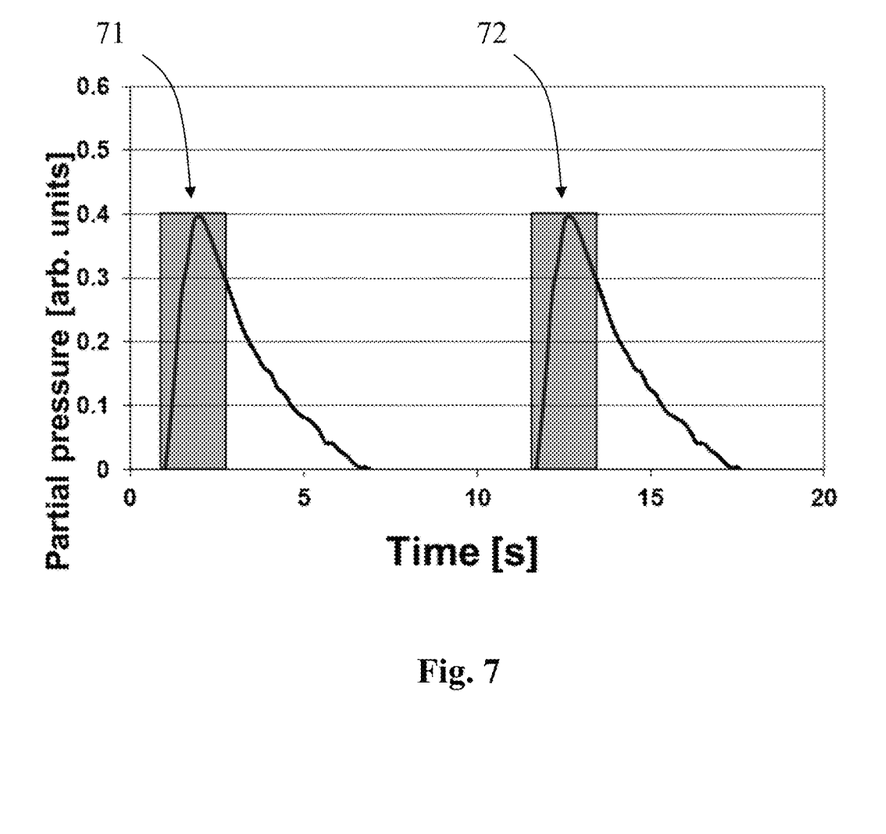
FIG. 7 shows an illustration of a partial pressure peak appearing immediately after opening the valve which supplies the precursor in a fast ALD processes, for example one using precursors having usable or substantial vapor pressure at room temperature, such as TMA or $H_2O$, and with relatively short purge times.

In fast ALD processing using precursors having usable or substantial vapor pressure at room temperature, such as TMA or $H_2O$, and with relatively short purge times, a partial pressure peak often appears immediately after opening the valve which supplies the precursor. This is illustrated as an example in FIG. 7. This partial pressure peak in the precursor pulse can react with a previous precursor pulse tail, or remainings, left after purging in the reaction space. This reaction can cause high partial pressures of precursor in the reaction space thus causing a high partial pressure precursor pulse. The amount of precursor entering the reaction space corresponds or is proportional to the partial pressure of the precursor multiplied by the time in which the precursor is entering the reaction space. This is illustrated with shadings 71 and 72 in FIG. 7. The areas of 71 and 72 are proportional to the amount of precursor entering the reaction chamber. For simplicity the shaded areas are drawn as rectangles illustrating the maximum amount of precursor entering the reaction space (e.g. the maximum vapor pressure times time). Another possibility is to follow the partial pressure, although in practice, depending on: measurement errors, measurement frequency/accuracy, measurement location or a combination thereof, the partial pressure curve shape and the shaded area might vary. FIG. 7 is merely an illustration, of arbitrary proportional amounts of precursor after the valve is opened in a fixed time. The time in both FIGS. 6 and 7 is the same and is roughly 2 seconds (e.g. the width of the shaded area rectangle).

These high partial pressure precursor pulses can cause particle formation and non-uniform parasitic CVD growth. This can be especially prevalent if a high partial pressure is occurring at the beginning of pulse and/or if there is a partial pressure peak in the beginning of pulse. Through modification of the partial pressure of the precursor supplied over time, and/or the pulse profile, particularly at the beginning of a pulse, better control over partial pressures of precursor within the reaction space can be achieved.

FIG. 6 shows an example of pulse profiles modified as discussed herein. An example of a pulse profile modification is that at first, a very low partial pressure pulse is introduced to the reaction space. The pulse profile of each pulse of reactant entering a reaction space can include less than half of the total amount of precursor within the first half of the pulse. By example, less than 50% or about 50% of the total amount of precursor in one pulse can be introduced to the reaction space during the first half, or about the first half of the pulse length. According to certain examples, very low partial pressure pulse can be less than 30%, 20% or even less than 10% of the total amount of precursor in a pulse is introduced to the reaction space during the first half of the pulse length.

Pulse length can be determined as the actual or nominal pulse length, e.g. the time from opening the precursor valve to the time of closing the valve to precursor vessel. Furthermore, a very low partial pressure pulse profile can also be realized as less than 25% or about 25%, of the total amount of precursor in the pulse is introduced to the reaction space during the first quarter (25%) of the pulse length. According to certain examples, the partial pressure can be even lower, e.g. less than 20%, 10% or even less than 5% of the total amount of precursor in the one pulse can be introduced to the reaction space during the first quarter of the pulse length.

According certain embodiments, a very low partial pressure pulse profile can also be realized as providing partial pressure having maximum of less than 25% or about 25%, of the highest partial pressure within the pulse to the reaction space during the first quarter (25%) of the pulse length. According to certain examples, the maximum partial pressure introduced to the reaction space during the first quarter of the pulse length can be even lower, e.g. less than 20%, 10% or even less than 5% of the highest partial pressure within the one pulse. According certain other embodiments, a very low partial pressure pulse profile can also be realized as providing partial pressure having maximum of less than 50% or about 50%, of the highest partial pressure within the pulse to the reaction space during the first half (50%) of the pulse length. According to certain examples, the maximum partial pressure introduced to the reaction space during the first half of the pulse length can be even lower, e.g. less than 30%, 20% or even less than 10% of the highest partial pressure within the one pulse. Furthermore, a very low dosage pulse profile can also be realized as less than 25% or about 25%, of the total amount of precursor in the pulse is introduced to the reaction space during the first quarter (25%) of the pulse length. According to certain examples, the dosage can be even lower, e.g. less than 20%, 10% or even less than 5% of the total amount of precursor in the one pulse can be introduced to the reaction space during the first quarter of the pulse length. In yet another embodiment a very low dosage pulse profile can also be realized as less than 50% or about 50%, of the total amount of precursor in the pulse is introduced to the reaction space during the half (50%) of the pulse length. According to certain examples, the dosage can be even lower, e.g. less than 30%, 20% or even less than 10% of the total amount of precursor in the one pulse can be introduced to the reaction space during the first half of the pulse length.

Following a very low partial pressure pulse introduction, a higher partial pressure pulse profile can be introduced, for example as illustrated by pulse profile 61 (the shaded area a). A further example of pulse profile modification is a pulse profile with a decreasing partial pressure as illustrated in pulse profile 62 (the shaded area b).

According certain embodiments, less than 50%, less than about 30%, less than about 20% or less than about 10% of the total amount of precursor in the one pulse is introduced to the reaction space in less than about the first 0.2 seconds of a precursor pulse, in less than about the first 0.5 seconds of precursor pulse or in less than about the first 1.0 second of precursor pulse. According to certain embodiments, less than 25%, less than about 20%, less than about 10% or less than about 5% of the total amount of precursor in one pulse is introduced to the reaction space in less than about the first 0.1 seconds of precursor pulse, in less than about the first 0.5 seconds of precursor pulse or in less than about the first 1.0 second of the precursor pulse.

Precursor pulse profiles provided herein provide for low partial pressure precursor pulses, e.g. precursor pulses having a lower partial pressure in the first quarter or half of the pulse compared to the remaining portion of the pulse. These low partial pressure precursor pulses allow for a more uniform reaction in the different sections of the reaction chamber. A more uniform reaction exhibits a lower growth rate with less gas phase reactions and particles. Such a uniform reaction can prevent the creation of particles and non-uniform parasitic CVD growth.

In a method of operating a system having a reactor configured to deposit thin films, amounts of reactants provided can be controlled. First, an amount of reactant from a reactant source vessel can be provided to a reaction space at a first volumetric flow rate. Subsequent to providing the first amount of reactant to the reaction space, a second amount of the reactant is provided to the reaction space at a second volumetric flow rate. The second volumetric flow rate should be greater than the first volumetric flow rate. The second amount of the reactant may be, but is not necessarily, sourced from the same reactant source vessel as the first amount.

After the second amount of the reactant is provided to the reaction space the reactant can be removed from the reaction space. Furthermore, the steps of: providing the first amount of reactant, subsequently providing the second amount of reactant and removing the reactant, can be performed sequentially and they can be performed multiple times, preferably in the mentioned order.

According to certain embodiments, the system having a reactor configured to deposit thin films is and/or is for performing an ALD process. In some embodiments, the average of the first volumetric flow rate during providing the first amount of reactant is less than about 75%, less than about 50%, less than about 30% or less than about 10% of the average of the second volumetric flow rate during the time of providing the second amount of reactant. The length or time of providing the first amount of reactant can be less than about 100%, less than about 50%, less than about 30% or less than about 20%, and in some cases can be less than about 10% of the corresponding length or time of providing the second amount of reactant.

As mentioned above it is desirable to control the partial pressure of precursor present in the reaction space over time and create an optimal precursor pulse profile. For example, to form a pulse profile in a method as discussed herein, the first amount of reactant can be limited to at most a predetermined percentage of the second amount of reactant. The timing of the first and second amount may also be controlled in order to optimize the pulse profiles. For example, to form a pulse profile in a method as discussed herein, the second amount can be provided at least a predetermined seconds or portion thereof after the initiation of providing the first amount. Furthermore a pulse profile could be constructed according to the method as discussed herein such that the first amount continues to flow at the same first flow rate after providing the second amount has been initiated. The pulse profile may also be such that the first amount is continuously provided to the reaction space.

The system of FIG. 1 may be used to implement the methods discussed herein. A precursor or reactant can flow from a precursor source 12 to a reactor 11 via two paths. The two paths split at point 13, a first which passes through valve 18 to valve 16 and a second which is controlled by valve 14. The first path can be periodically substantially restricted by valve 16. The first path can also be continuously restricted by valve 18. The second path can be periodically substantially restricted by valve 14. In FIG. 1, both paths converge at a four-way valve 14, 15, 16, 17 and continue from 17 in a single path to the reactor 11. The valve 16 which substantially restricts the flow of the first path may be operated such that when the second path is substantially restricted, there is no flow of reactant from the second path entering the reaction space. The system 10 of FIG. 1 operated in accordance with the methods described herein can allow for greater control and modification of the pulse profile which can avoid the creation of particles and promote uniform reaction.

The pulse profile, e.g. as shown as 62 in FIG. 6, can also be controlled accurately by, for example, using a mass flow controller (MFC), connected to a source line and ramping up the flow rate in desired manner accurately. The MFC can be controlled by a computer, processor or controller. Furthermore, with a computer controlled MCF the desired pulse profile can be achieved, programmed, pre-programmed and/or controlled.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A method of operating a system having a reactor configured to deposit thin films, said method comprising the steps of:
   dividing a flow of a reactant from a reactant source vessel in to two separate paths,
   substantially restricting the flow of a first path of the two separate paths in a periodic manner,
   substantially restricting the flow of a second path of the two separate paths in a periodic manner, and
   combining the flow from the second path with the flow from the first path at a point after restriction and prior to entry of a reaction space.

2. A method according to claim 1, wherein a combined flow comprising at least a portion from each path is fed to the reaction space during at least one period of time during operation of the system.

3. A method according to claim 1, wherein a pulse profile of the combined flow entering the reaction space for each pulse of reactant includes less than half of the total amount of precursor within the first half of the pulse.

4. A method according to claim 3, wherein the pulse profile is controlled by during the substantially restricting steps of the first and second paths of flow of the reactant.

5. A method according to claim 1, wherein when either or both of the first or second paths are substantially restricted, there is no flow of reactant from said corresponding path entering the reaction space.

6. A method according to claim 1, wherein the period in restricting the flow of a first path in a periodic manner comprises a purge step.

7. A method according to claim 1, wherein the period in restricting the flow of a first path in a periodic manner comprises a purge step of an ALO process.

8. A method according to claim 1, wherein the reactor configured to deposit thin films is performing an ALO process.

9. A method according to claim 1, wherein the flow in the first path is restricted by passing through a needle valve or a mass flow controller.

10. A method according to claim 1, wherein the first and second paths are combined at a four-way valve including the first and second paths, a path for a purge gas and a path to the reaction space.

11. A method according to claim 1, further comprising performing an ALD process in the reactor.

* * * * *